(12) United States Patent
Yi et al.

(10) Patent No.: US 6,207,481 B1
(45) Date of Patent: Mar. 27, 2001

(54) THIN FILM TRANSISTOR HAVING A CRYSTALLIZATION SEED LAYER AND A METHOD FOR MANUFACTURING THEREOF

(75) Inventors: Jong-Hoon Yi; Sang-Gul Lee, both of Seoul (KR)

(73) Assignee: LG. Phillips LCD Co., Ltd., Seoul (KR)

( * ) Notice: Subject to any disclaimer, the term of this patent is extended or adjusted under 35 U.S.C. 154(b) by 0 days.

(21) Appl. No.: 09/458,468

(22) Filed: Dec. 9, 1999

(30) Foreign Application Priority Data

Mar. 24, 1999 (KR) .................................................. 99-10051

(51) Int. Cl.⁷ ................................................ H01L 29/786
(52) U.S. Cl. .............................. 438/166; 438/487; 257/66
(58) Field of Search ..................................... 438/149, 161, 438/163, 166, 183, 482, 486, 487; 257/66

(56) References Cited

U.S. PATENT DOCUMENTS

| 5,569,936 | * | 10/1996 | Zhang et al. ............................. 257/66 |
| 5,595,923 | * | 1/1997 | Zhang et al. ........................... 438/166 |
| 5,891,766 | * | 4/1999 | Yamazaki et al. ..................... 438/166 |
| 5,913,113 | * | 6/1999 | Seo ........................................ 438/166 |
| 5,923,961 | * | 7/1999 | Shibuya et al. ....................... 438/149 |
| 6,066,547 | * | 5/2000 | Maekawa .............................. 438/486 |
| 6,077,730 | * | 6/2000 | Lee et al. .............................. 438/149 |

* cited by examiner

Primary Examiner—Olik Chaudhuri
Assistant Examiner—Anh Duy Mai

(57) ABSTRACT

A thin film transistor and a method of manufaturing a thin film transistor are such that a crystallization seed layer is included in the transistor to crystallize the amorphous silicon to polysilicon.

16 Claims, 10 Drawing Sheets

THIN FILM TRANSISTOR HAVING A CRYSTALLIZATION SEED LAYER AND A METHOD FOR MANUFACTURING THEREOF

BACKGROUND OF THE INVENTION

1. Field of the Invention

The present invention relates to a structure of a thin film transistor and a manufacturing method thereof, and more specifically, the present invention relates to a a thin film transistor having a cystallization seed layer on an active layer, and a method of manufacturing such a thin film transistor in which an active layer is formed by crystallizing an amorphous silicon thin film.

2. Description of the Background Art

Thin film transistors (TFTs) are used as switching devices for a pixel block and as driving devices for a driver circuit block in an active matrix type liquid crystal display (LCD). It is preferable to form the TFTs of the pixel block and the driver circuit block with the same material so that the number of steps in the manufacturing process is reduced.

The TFTs of the pixel block, whether they are formed from amorphous silicon or polysilicon, do not effect the performance of the LCD. However, the TFTs in the driver circuit block require high speed performance. Thus, the TFTs of the driver circuit block should not be formed from amorphous silicon, which is characterized by low electron mobility.

Accordingly, techniques have been developed in which an active layer is made from polysilicon. In the prior art, a polysilicon film is formed by depositing amorphous silicon and then crystallizing the amorphous silicon using a heat treatment. More specifically, the amorphous silicon film is deposited at a relatively low temperature of about 350° C. and then crystallized into polysilicon by a laser annealing process or other similar process. The crystallization of the amorphous silicon is performed so that silicon grains are grown from the amorphous silicon. The silicon grains stop growing as they adjoin the adjacent grains so that a grain boundary is created between the adjoining grains.

FIG. 1 is a cross-sectional view of a thin film transistor according to the prior art.

Referring to FIG. 1, a buffer layer 13 is formed on a substrate 11, and an active layer 15 made of polysilicon is formed on the buffer layer 13. A gate insulating film 19 and a gate electrode 21 made from a conductive metal such as aluminum or molybdenum is laminated on a portion of the active layer 15. For example, the gate electrode 21 is shorter than the gate insulating film 19 so that centering the gate electrode 21 with respect to the active layer 15 exposes both ends of the gate insulating film 19.

Next, N or P type impurities are implanted on each side of the gate electrode 21 within the active layer 15. Thus, the portion on the active layer 15 not covered by the gate insulating film 19 is heavily doped with impurities and forms a source region 23 and a drain region 25, while the portion that is covered by the gate insulating film 19 is lightly doped with impurities to form a lightly doped drain (LDD) region 27. The portion within the active layer 15 that is covered by the gate electrode 21 forms a channel region. Note that the active layer 15, which includes the source region 23, the drain region 25, and the LDD region 27, is made of polysilicon, which was crystallized from amorphous silicon using laser radiation.

A first insulating layer 29 made of either silicon oxide or silicon nitride is formed on the entire surface of the structure, and a first contact hole 31 exposing the source and drain regions 23 and 25 is created in the first insulating layer 29. Thereafter, the source electrode 33 and the drain electrode 34, made from a metal such as aluminum, are formed in the first contact hole 31. Thus, the source and drain electrodes 33 and 34 are electrically connected to the source and drain regions 23 and 25, respectively.

A second insulating layer 35 made from an insulator such as silicon oxide or silicon nitride is formed on the first insulating layer 29 and covers the source and drain electrodes 33 and 34. A second contact hole 37 formed in the second insulating layer 35 exposes the drain electrode 34. Thereafter, a pixel electrode 39 is formed on the second insulating layer 35. Thus, the pixel electrode 39 is electrically connected to the drain electrode 34. Note that the pixel electrode 39 is made from a transparent conductive material such as ITO (Indium Tin Oxide) or TO (Tin Oxide).

FIGS. 2A–2E are cross-sectional views illustrating a process for manufacturing a thin film transistor according to the prior art.

Referring to FIG. 2A, silicon oxide is deposited on a transparent substrate 11 such as glass using a chemical vapor deposition (CVD) method to form a buffer layer 13. Amorphous silicon is deposited on the buffer layer 13 and then crystallized with laser radiation to form an active layer 15. The buffer layer 13 prevents the impurities from the substrate 11 from penetrating into the active layer 15. Thereafter, the active layer 15 is patterned so that only a select portion thereof remains on the buffer layer 13.

Referring to FIG. 2B, an insulating material such as silicon oxide or silicon nitride is deposited using the CVD method and covers the active layer 15. Thereafter, a conductive metal such as aluminum or molybdenum is deposited on the insulating material. Next, a photoresist 17 is coated on the conductive metal and then patterned by exposure and development so that it covers the portion corresponding to the channel region of the active layer 15. Using the photoresist 17 as a mask, the conductive metal and the insulating material are then sequentially patterned to form a gate electrode 21 and a gate insulating film 19. To form the gate electrode 21, the conductive metal is patterned by an isotropic etching process which leaves the insulating material exposed. Therefter, to form the gate insulating film 19, the insulating material is etched anisotropically which leaves the active layer 15 exposed. Note that the gate electrode 21 is formed so as to be shorter than the gate insulating film 19.

Referring to FIG. 2C, the photoresist 17 is removed. Using the gate electrode 21 as a mask, an N type impurity such as phosphorus (P) or a P type impurity such as boron (B) is used to heavily dope, with low energy, the source and drain regions 23 and 25, and to lightly dope, with high energy, the LDD region 27. Note that the source and drain regions 23 and 25 are formed at an exposed portion of the active layer 15, while the LDD region 27 is formed at a select portion of the active layer 15 which is covered by the gate insulating film 19. Further, the section in the active layer 15 located below the gate electrode 21 defines a channel region in the active layer 15.

Referring to FIG. 2D, an insulating material such as silicon oxide or silicon nitride is deposited on the entire surface of the structure using the CVD method to form a first insulating layer 29. Then, a select portion of the first insulating layer 29 is patterned using a photolithography process to create a first contact hole 31 that exposes the source and drain regions 23 and 25.

Next, a conductive metal such as aluminum is deposited on the first insulating layer 29 and covers the first contact hole 31 so that it comes into contact with the source and drain regions 23 and 25, thus forming a source electrode 33 and a drain electrode 34. Note that while the source and drain electrodes 33 and 34 are being created, a data line (not shown) is also formed so that it is connected to the source electrode 33.

Referring to FIG. 2E, an insulating material such as silicon oxide or silicon nitride is deposited on the first insulating layer 29 using the CVD method and covers the source and drain electrodes 33 and 34, thus forming a second insulating layer 35. Thereafter, the second insulating layer 35 is etched by a photolithography process to create a second contact hole 37 that exposes the drain electrode 34. Next, a transparent conductive material such as ITO or TO is deposited on the second insulating layer 35 and then patterned so that it is in contact with the drain electrode 34, and thus, it forms a pixel electrode 39.

As described above, the prior art thin film transistor has an active layer that is formed from amorphous silicon which is crystallized into polysilicon by a laser annealing process. However, the thin film transistor in the prior art is inadequate because the crystals that are formed during the crystallization are not uniform in size due to the non-uniform density of the laser beam used during the laser annealing process. Thus, the electrical properties of the transistor are also not uniform. Further, the bottom portion of the active layer that is not melted completely crystallizes upward and stops growing when it adjoins the adjacent grains. This causes the grain boundary to project from the surface of the active layer so that the surface of the active layer is uneven, thus further contributing to defective operation of the resulting transistor. The defective operation of the transistors causes malfunction and poor display quality on a liquid crystal display apparatus incorporating such transistors.

SUMMARY OF THE INVENTION

To overcome the problems described above, preferred embodiments of the present invention provide a thin film transistor having polysilicon crystals that are uniform in size so that the transistor achieves uniform electrical properties while preventing oxidation of source and drain regions so that contact resistance is minimized.

Other preferred embodiments of the present invention provide a method for manufacturing a thin film transistor where deterioration of transistor characteristics are prevented by planarizing the surface of the active layer.

According to a preferred embodiment of the present invention, a method for manufacturing a thin film transistor is provided so that the contact resistance is minimized by preventing oxidation of the source and drain regions by the source and drain electrodes by creating interconnecting layers that electrically connect the source and drain regions with the source and drain electrodes, respectively.

According to another preferred embodiment of the present invention, a thin film transistor includes a substrate, an active layer made of polysilicon on the substrate, the active layer having a source region and a drain region on opposite sides of the active layer and having a substantially central portion that defines a channel region, a crystallization seed layer on the surface of the active layer except on the substantially central portion thereof that defines the channel region, a gate insulating layer covering the active layer and the crystallization seed layer, and a gate electrode on the gate insulating layer arranged to cover the channel region of the active layer and to overlap a portion of the crystallization seed layer.

According to another preferred embodiment of the present invention, a method of manufacturing a thin film transistor includes the steps of depositing amorphous silicon on a substrate and patterning the deposited amorphous silicon to form an active layer, forming a block layer on a central portion of the active layer to define a channel region, silicidizing an exposed surface of the active layer to form a crystallization seed layer, removing the block layer, forming a gate insulating layer on the substrate that covers the active layer and the crystallization seed layer, forming a gate electrode on the gate insulating layer to cover the channel region of the active layer and overlap a portion of the crystallization seed layer, heavily doping impurities in the active layer using the gate electrode as a mask to form source and drain regions, and converting the active layer from amorphous silicon to polysilicon by a metal induced lateral crystallization process, which is caused by the crystallization seed layer.

According to another preferred embodiment of the present invention, a method of manufacturing a thin film transistor includes the steps of forming buried source and drain layers at a portion of a substrate, forming a buffer layer on the substrate to cover the buried source and drain layers, depositing amorphous silicon on the buffer layer and patterning the deposited amorphous silicon to form an active layer, forming a block layer on a substantially central portion of the active layer to define a channel region, silicidizing an exposed surface of the active layer to form a crystallization seed layer, removing the block layer, forming a gate insulating layer on the buffer layer so as to cover the active layer and the crystallization seed layer, forming a gate electrode on the gate insulating layer so as to cover the channel region of the active layer and overlap a portion of the crystallization seed layer, heavily doping impurities in the active layer using the gate electrode as a mask to form source and drain regions, and converting the active layer from amorphous silicon to polysilicon by a metal induced lateral crystallization process caused by the crystallization seed layer while activating the doped impurities, forming an insulating layer covering the gate electrode on the gate insulating layer, forming a first contact hole exposing the crystallization seed layer on the source and drain regions, and a second contact hole which exposes the buried source and drain layers, forming a first interconnecting layer that connects the buried source layer and the crystallization seed layer on the source region, and a second interconnecting layer that connects the second buried layer to the crystallization seed layer on the drain region.

According to another preferred embodiment of the present invention, a method of manufacturing a thin film transistor includes the steps of depositing amorphous silicon on a substrate and patterning the deposited amorphous silicon to form an active layer, forming a block layer on a substantially central portion of the active layer to define a channel region, silicidizing an exposed surface of the active layer to form a crystallization seed layer, removing the block layer, forming a gate insulating layer on the substrate so as to cover the active layer and the crystallization seed layer, forming a gate electrode on the gate insulating layer so as to cover the channel region of the active layer and overlap a portion of the crystallization seed layer, heavily doping impurities into the active layer using the gate electrode as a mask to form source and drain regions, and forming an insulating layer on the gate insulating layer to cover the gate electrode, and converting the active layer from amorphous silicon to polysilicon through a metal induced lateral crystallization process, which is caused by the crystallization seed layer.

Other features, advantages and elements of the present invention will be described in more detail below with reference to the attached drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein.

DETAILED DESCRIPTION OF PREFERRED EMBODIMENTS

Figure 1:
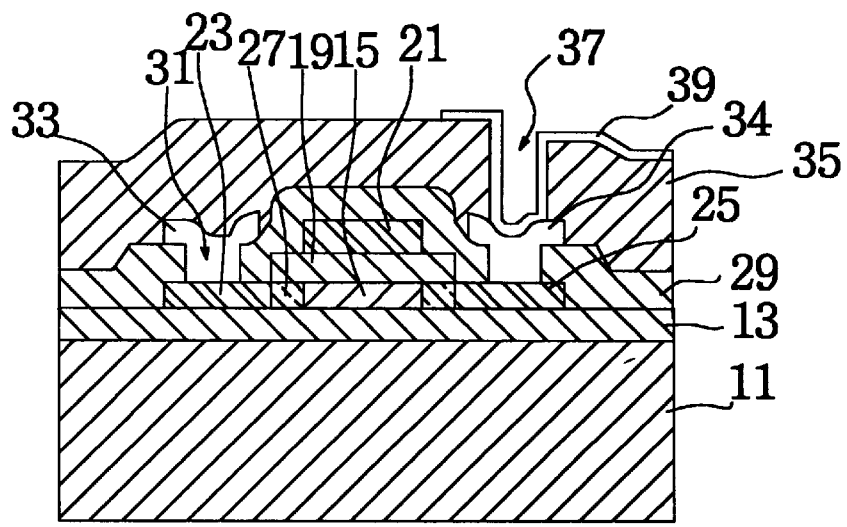
FIG. 1 is a cross-sectional view of a thin film transistor according to the prior art.
Figure 2A:
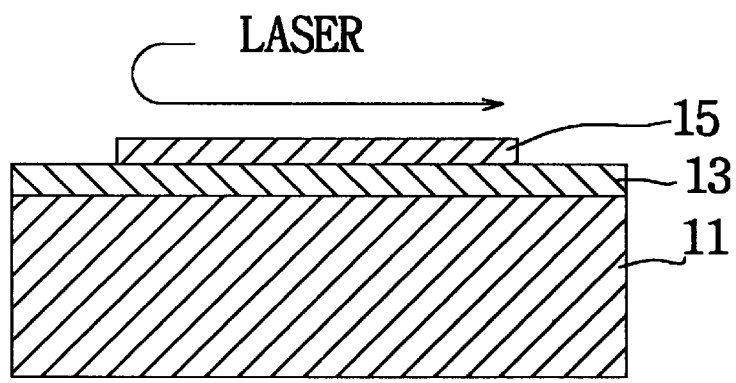
FIGS. 2A–2E are cross-sectional views illustrating a process for manufacturing a thin film transistor according to the prior art.
Figure 2B:
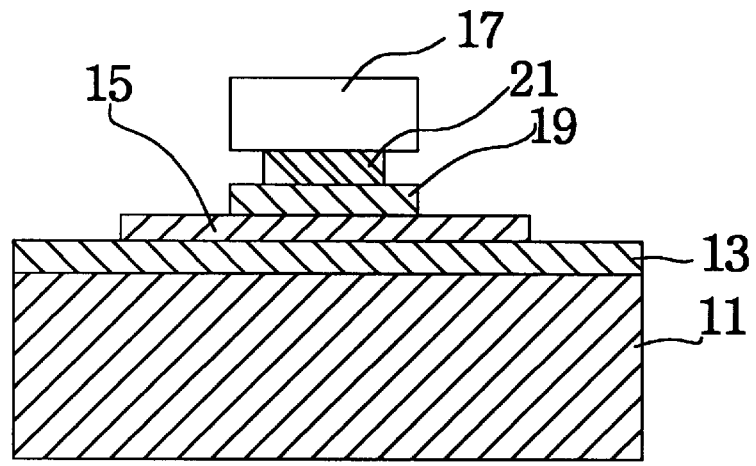
Figure 2C:
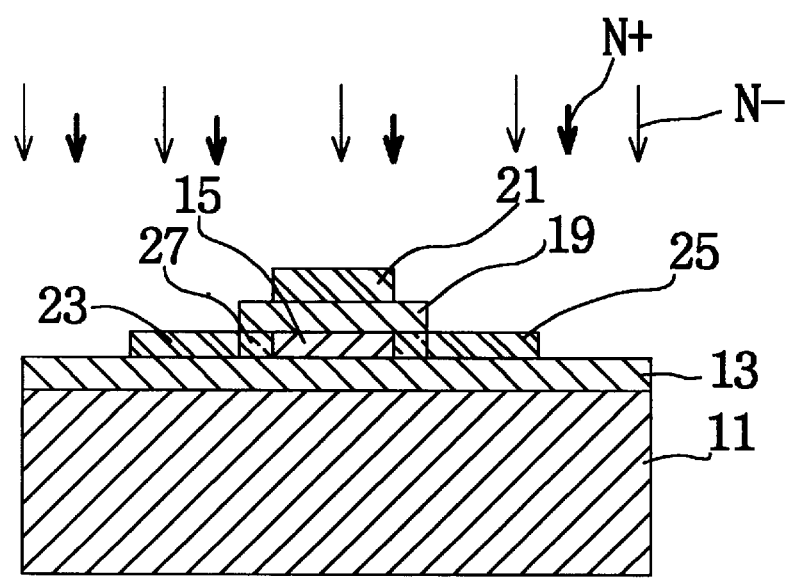
Figure 2D:
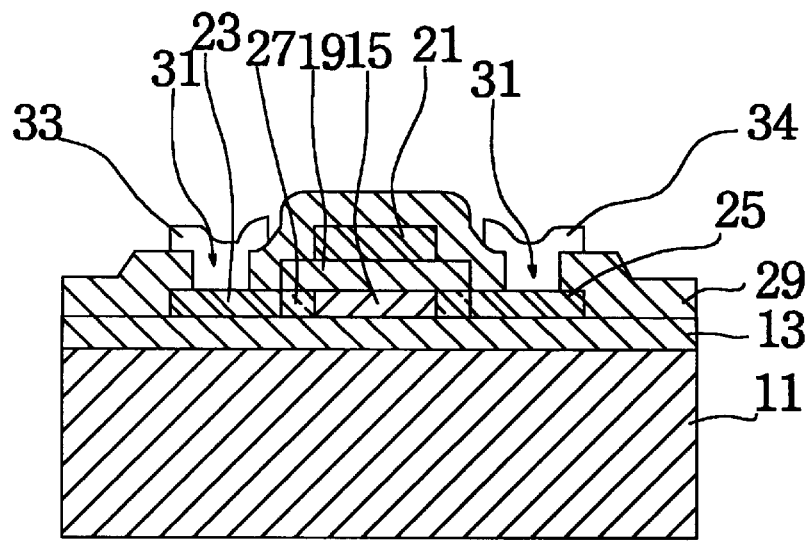
Figure 2E:
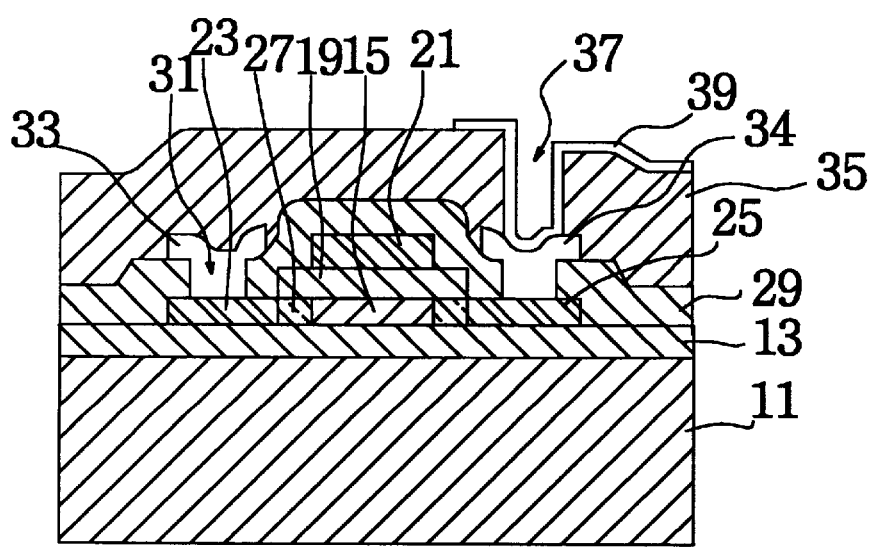
Figure 3:
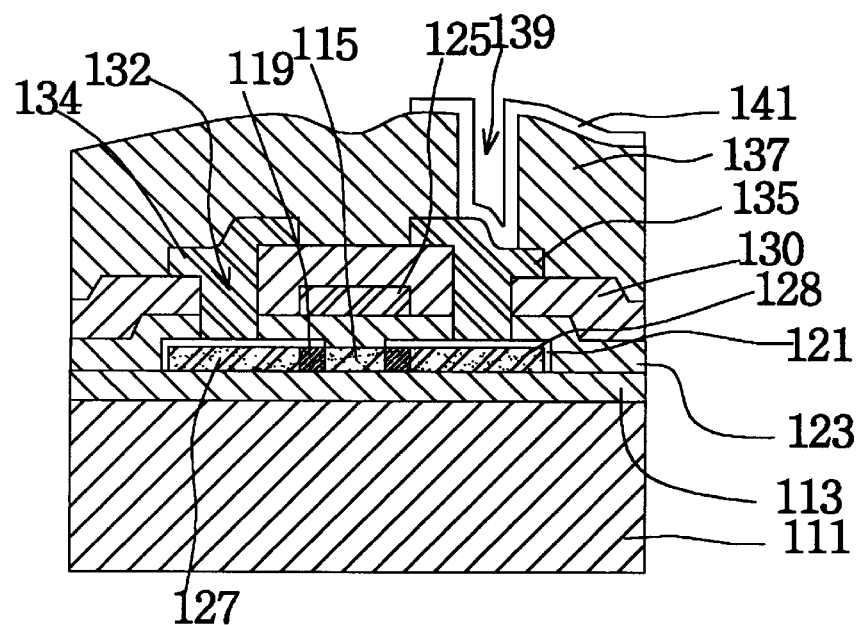
FIG. 3 is a cross-sectional view of a thin film transistor according to a first preferred embodiment of the present invention.

FIG. 3 is a cross-sectional view of a thin film transistor according to a first preferred embodiment of the present invention.

Referring to FIG. 3, a thin film transistor in accordance with a preferred embodiment of the present invention preferably includes a buffer layer 113 provided on a substrate 111. An active layer 115, formed from patterned polysilicon, is located on a portion on the buffer layer 113, and a crystallization seed layer 121 is provided preferably at a substantially central location on the surface of the active layer 115, for example, on a portion other than a channel region in the active layer 115. Also, the crystallization seed layer 121 is preferably formed on the side surfaces of the active layer 115.

The crystallization seed layer 121 is preferably made of silicide which is made by the reaction between a metal capable of being silicidized (i.e., titanium (Ti), chrome (Cr), nickel (Ni), molybdenum (Mo), tantalum (Ta), cobalt (Co), platinum (Pt) or tungsten (W)), and the active layer 115. The crystallization seed layer 121 is created by a metal induced lateral crystallization (MILC) process that turns the active layer 115 from amorphous silicon to polysilicon crystals. The crystals that are formed are uniform in size, thus the electrical properties of the resulting transistor are also uniform. Further, the electron mobility of the resulting transistor is also increased by the crystallization process.

Next, N or P type impurities are implanted on both sides of the active layer 115. In order to form a source region 127 and a drain region 128, the N or P type impurities are heavily doped on both ends of the active layer 115. An approximately central portion of the active layer 115 is not doped with impurities and defines a channel region in the active layer 115. However, a portion of the active layer 115 which is located between the source and drain regions 127 and 128 and the channel region, is lightly doped and defines a LDD region 119.

A gate insulating layer 123 preferably made of silicon oxide or silicon nitride is formed on the buffer layer 113 and covers the active layer 115 and the crystallization seed layer 121. Thereafter, a gate electrode 125 preferably made from a conductive metal such as aluminum or molybdenum is formed on the gate insulating layer 123 at a location which corresponds to the channel region of the active layer 115.

A first insulating layer 130 preferably made of silicon oxide or silicon nitride is formed on the gate insulating layer 123 and covers the gate electrode 125. A first contact hole 132 is created in the gate insulating layer 123 and the first insulating layer 130, thus exposing the crystallization seed layer 121. Thereafter, the source electrode 134 and the drain electrode 135, which are made from a metal such as aluminum, are provided in the first contact hole 132 and contact the crystallization seed layer 121. Note that the source and drain electrodes 134 and 135 are electrically connected to the source and drain regions 127 and 128 through the crystallization seed layer 121.

Next, a second insulating layer 137 preferably made of an insulating material such as silicon oxide or silicon nitride is formed on the first insulating layer 130 and covers the source and drain electrodes 134 and 135. A second contact hole 139 is formed in the second insulating layer 137 and exposes the drain electrode 135. Thereafter, a pixel electrode 141 is formed on the second insulating layer 137, and is electrically connected to the drain electrode 135. In the preferred embodiments, the pixel electrode 141 is preferably made of a transparent conductive material such as ITO or TO.

Figure 4:
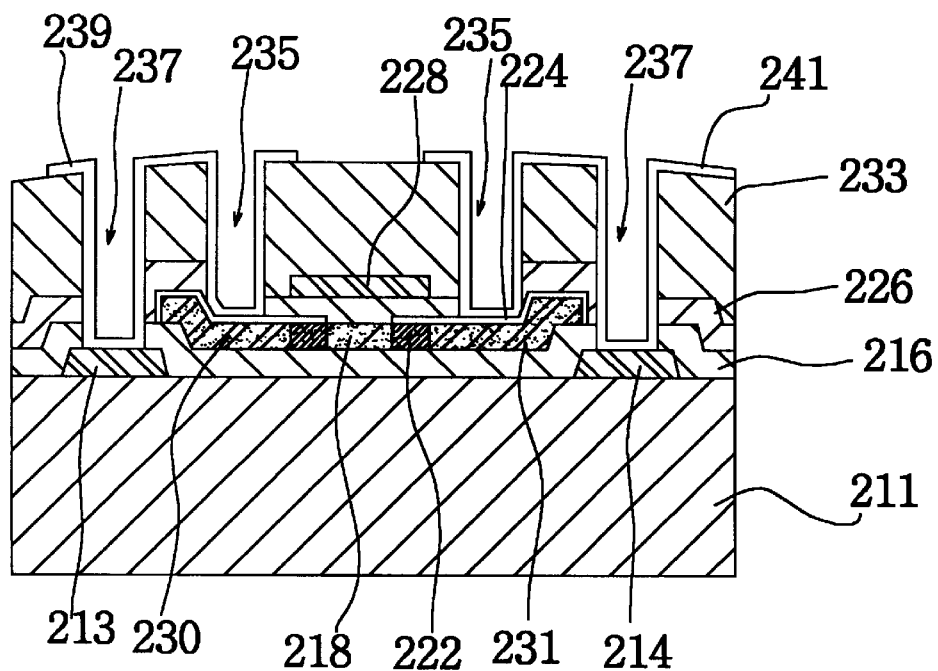
FIG. 4 is a cross-sectional view of a thin film transistor according to a second preferred embodiment of the present invention.

FIG. 4 is a cross-sectional view of a thin film transistor according to a second preferred embodiment of the present invention.

In the second preferred embodiment, there are separate buried source and drain layers 213 and 214, which are made from a metal such as aluminum or molybdenum, selectively located on a substrate 211. Note that the buried source and drain layers 213 and 214 are separated from each other.

A buffer layer 216 made of silicon oxide or silicon nitride is deposited on the substrate 211 and covers the buried source and drain layers 213 and 214. An active layer 218, which is made of patterned polysilicon, is disposed on the buffer layer 216 between the buried source and drain layers 213 and 214. A crystallization seed layer 224 is provided on the active layer 218 except at an approximately central portion of the active layer 218. The crystallization seed layer 224 is also preferably disposed on the patterned side surfaces of the active layer 218.

The crystallization seed layer 224 is preferably made of silicide which is formed by the reaction of between metal that can be silicidized (i.e., titanium (Ti), chrome (Cr), nickel (Ni), molybdenum (Mo), tantalum (Ta), cobalt (Co), platinum (Pt) or tungsten (W)) and the active layer 218. The crystallization seed layer 224 is created by a metal induced lateral crystallization (MILC) process that turns the active layer 218 from amorphous silicon to polysilicon crystals. The crystals that are formed are uniform in size, thus the electrical properties of the resulting transistor are also uniform. Further, the electron mobility in the resulting transistor is increased by the crystallization process.

Next, N or P type impurities are implanted on both sides of the active layer 218. In order to define source and drain regions 230 and 231, the N or P type impurities are heavily doped on both ends of the active layer 218. An approximately central portion in the active layer 218 is not doped with impurities and defines a channel region in the active layer 218. However, a portion of the active layer 218, which is located between the source and drain regions 230 and 231 and the channel region, is lightly doped to define a LDD region 222.

A gate insulating layer 226 preferably made of silicon oxide or silicon nitride is formed on the buffer layer 213 and covers the active layer 218 and the crystallization seed layer 224. Thereafter, a gate electrode 228 made from a conductive metal such as aluminum or molybdenum is formed on the gate insulating layer 226 at a location which corresponds to the channel region of the active layer 218.

An insulating layer 233 preferably made of silicon oxide or silicon nitride is formed on the gate insulating layer 226 and covers the gate electrode 228. A first contact hole 235 is formed and exposes the crystallization seed layer 224. Next, a second contact hole 237 is formed and exposes the buried source and drain layers 213 and 214. The first contact hole 235 is formed by etching the gate insulating layer 226 and the insulating layer 233, while the second contact hole 237 is formed by etching the buffer layer 216, the gate insulating layer 226 and the insulating layer 233.

Next, a first interconnecting layer 239 electrically connects the buried source layer 213 and the source region 230, and a second interconnecting layer 241 electrically connects the buried drain layer 214 and the drain region 231. The first and second interconnecting layers 239 and 241 are preferably made from a transparent conductive material such as ITO or TO, and are not in direct contact with the source and drain regions 230 and 231. Instead, the crystallization seed layer 224 is interposed between the first and second interconnecting layers 239 and 241 and the source and drain regions 230 and 231.

Thus, the crystallization seed layer 224 prevents oxidation of the source and drain regions 230 and 231 from being caused by the ITO or TO of the first and second interconnecting layers 239 and 241 so that no increase in contact resistance occurs. The second interconnecting layer 241 is also used as a pixel electrode since it extends to a pixel region (not shown) and has an electrical connection with the drain region 231 when the buried drain layer 214 is not formed.

FIGS. 5A–5E are cross-sectional views illustrating a process for manufacturing the thin film transistor according to the first preferred embodiment of the present invention, as shown in FIG. 3.

Figure 5A:
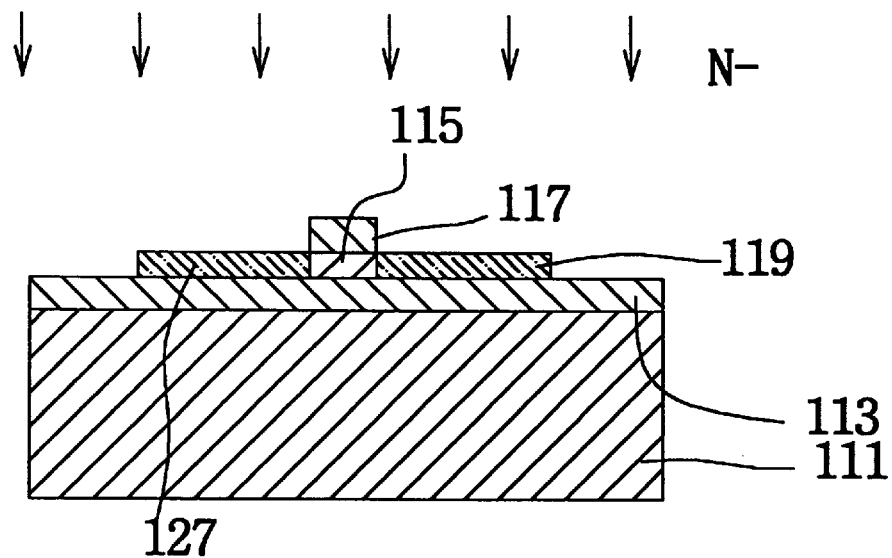
FIGS. 5A–5E are cross-sectional views illustrating a process for manufacturing the thin film transistor according a first preferred embodiment of the present invention as shown in FIG. 3.

Referring to FIG. 5A, silicon oxide or silicon nitride is deposited on the substrate 111 using the CVD method to form the buffer layer 113. Next, amorphous silicon is deposited on the buffer layer 113 using the CVD method and then patterned by a photolithography process to form the active layer 115. Because the active layer 115 is made of amorphous silicon, the heat temperature during the deposition process is relatively low.

Thereafter, a block layer 117 is deposited on the approximately central portion of the active layer 115. The block layer 117 is formed by depositing silicon oxide or silicon nitride on the buffer layer using the CVD method so as to cover the active layer 115, and then patterning the deposited silicon oxide or silicon nitride by a photolithography process so that the deposited silicon oxide or silicon nitride remains only on the approximate central portion of the active layer 115. Note that the block layer 117 has preferably a different etching selection ratio from that of the buffer layer 113. The buffer layer 113 prevents the impurities that are in the substrate 111 from contaminating the active layer 115 while the active layer 115 is being formed.

Using the block layer 117 as a mask, N type impurities such as phosphorus (P) or P type impurities such as boron (B) lightly dope an exposed portion of the active layer 115 to form the LDD region 119. The approximately central portion of the active layer 115 is not doped with impurities because of the block layer 117 and forms a channel region in the active layer 115.

Figure 5B:
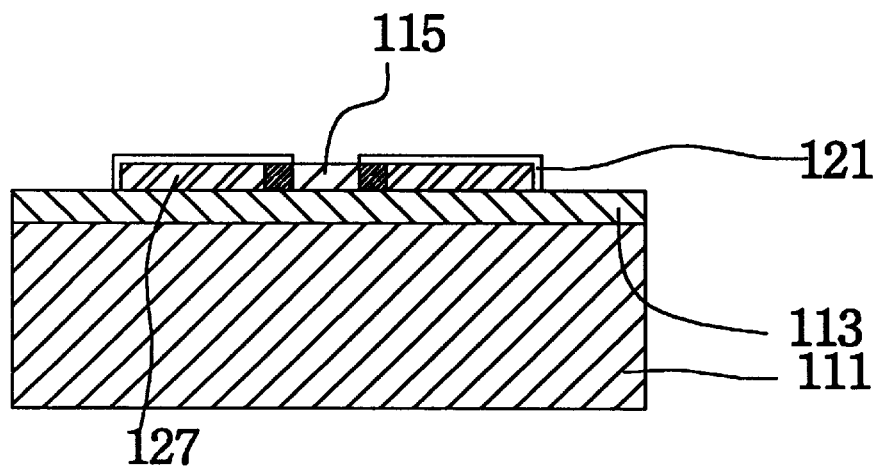

Referring to FIG. 5B, the LDD region 119 is silicidized to form the crystallization seed layer 121. The silicidization process preferably includes sputttering a metal capable of being silicidized, and preferably having a thickness of about 30 $\mu$m to about 100 $\mu$m on the buffer layer 113 so that the sputtered metal layer covers the active layer 115 and the block layer 117. A spontaneous reaction between the active layer 115 and the metal causes the boundary to be silicidized into the crystallization seed layer 121. Note that the buffer layer 113 and the block layer 117 do not react with the metal so that these layers are not silicidized. Thus, the extraneous metal on the buffer layer 113 and the block layer 117 are selectively removed preferably using wet etching with phosphoric acid (H3PO4), nitric acid (HNO3), acetic acid, (NH4)2S2O8 or a mixture of phosphoric acid, acetic acid, nitric acid and water or other suitable etchant. Next, the block layer 117 is selectively removed preferably etching preferably with fluoric acid or phosphoric acid or other suitable etchant.

Figure 5C:
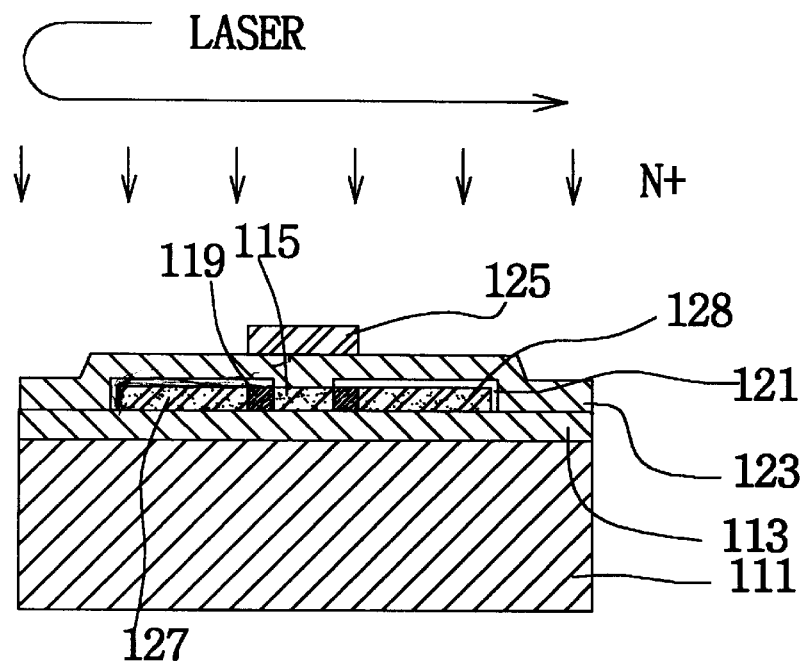

Referring to FIG. 5C, silicon oxide or silicon nitride is deposited on the buffer layer 113 using the CVD method and covers the active layer 115 and the crystallization seed layer 121, thus forming a gate insulating layer 123.

Next, a gate electrode 125 is formed on the gate insulating layer 123 at a location which corresponds to the channel region of the active layer 115. The gate electrode 125 is formed by depositing a conductive metal such as aluminum or molybdenum on the gate insulating layer 123 using either the CVD method or the sputtering method and then patterning deposited metal preferably via a photolithography process. Note that the gate electrode 125 preferably overlaps with a portion of the crystallization seed layer 121.

Thereafter, N type impurities such as phosphorus (P) or P type impurities such as boron (B) heavily dope a portion of the active layer 115 that is not covered by the gate electrode 125, and form a source region 127 and a drain region 128. The LDD region 119 is now preferably limited to the portion in the active layer 115 which is overlapped with the gate electrode 125.

The impurities in the active layer 115 that form the LDD region 119 and the source and drain regions 127 and 128 are treated with laser radiation or heated in a furnace preferably at about 400° C. to about 600° C. for about 1–3 hrs. During this process, the amorphous silicon in the active layer 115 is crystallized into polysilicon through the MILC process which is caused by the crystallization seed layer 121. As the active layer 115 transforms from amorphous silicon to polysilicon, the crystals become large and uniform, thus the electrical properties of the resulting transistor also become uniform. Further, the electron mobility in the resulting transistor is also increased.

Note also that the active layer 115 is crystallized from the top to the bottom with the crystallization seed layer 121 functioning as a seed so that the grain boundary does not project from the surface of the active layer 115, and so that the surface of the active layer 115 is also planarized. This also prevents additional defects in transistor characteristics from occuring.

Figure 5D:
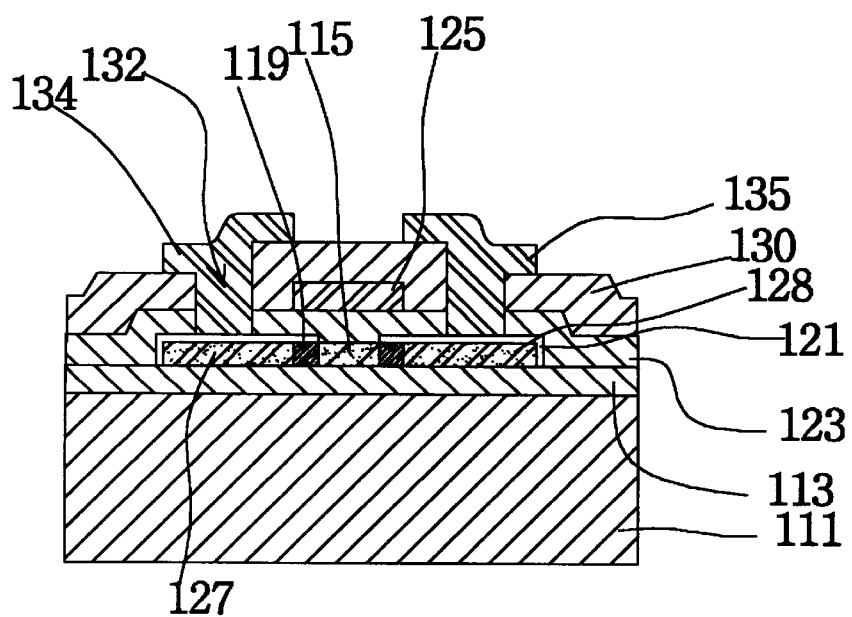

Referring to FIG. 5D, silicon oxide or silicon nitride is deposited on the gate insulating layer 123 using the CVD method and covers the gate electrode 125, thus forming a first insulating layer 130. The first insulating layer 130 is formed preferably at a temperature thta is greater than about 400° C. so that the heat crystallizes the inadequately crystallized portion of the active layer 115. So again, the resulting transistor characteristics are even more greatly improved by the the preferred embodiments of the present invention.

Next, the first insulating layer 130 and the gate insulating layer 123 are etched to form a first contact hole 132, which exposes the crystallization seed layer 121. Thereafter, a metal such as aluminum or molybdenum is sputtered on the first insulating layer 130 and comes into contact with the crystallization seed layer 121. The sputtered metal is then patterned and forms the source electrode 134 and the drain electrode 135, which are electrically connected to source and drain regions 127 and 128, respectively.

Figure 5E:
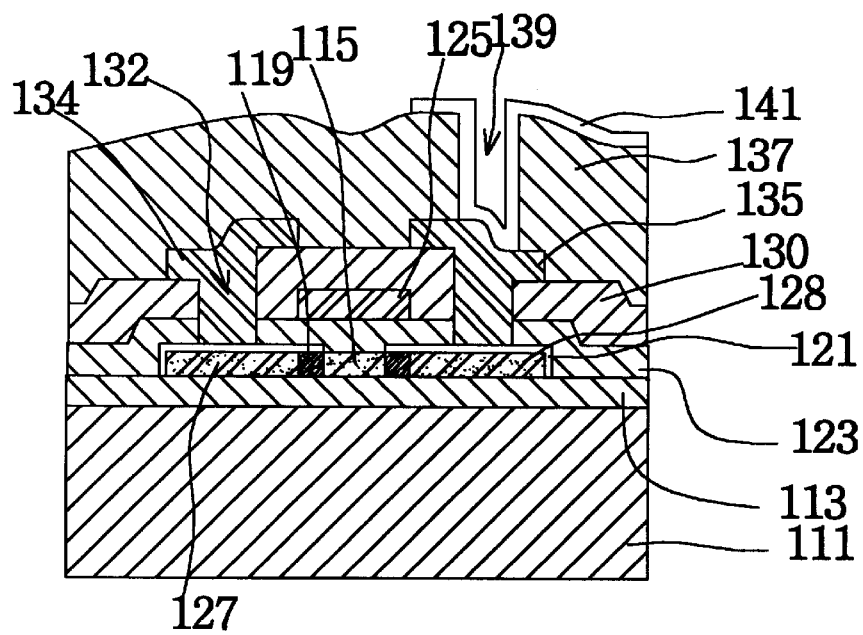

Referring to FIG. 5E, an insulating material such as silicon oxide or silicon nitride is deposited on the first insulating layer 130 using the CVD method so that the insulating material covers the source and drain electrodes 134 and 135, thus forming the second insulating layer 137. The second insulating layer 137 is etched and creates a second contact hole 139 that exposes the drain electrode 135. A transparent conductive material such as ITO or TO is deposited on the second insulating layer 137 so that it is in contact with the drain electrode 135. The transparent conductive material is then patterned to form a pixel electrode 141, which is electrically connected to the drain electrode 135.

FIGS. 6A–6E are cross-sectional views illustrating a process for manufacturing a thin film transistor according to a second preferred embodiment of the present invention, as shown in FIG. 4.

Figure 6A:
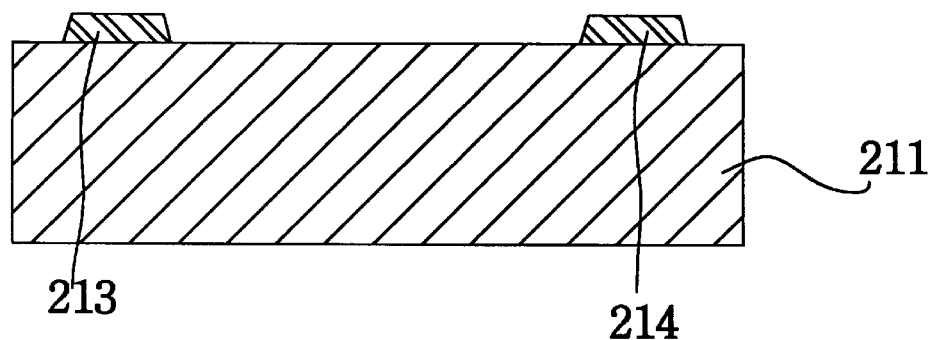
FIGS. 6A–6D are cross-sectional views illustrating a process for manufacturing the thin film transistor according to a second preferred embodiment of the present invention as shown in FIG. 4.

Referring to FIG. 6A, a metal such as aluminum or molybdenum is sputtered on a substrate 211. The deposited metal is then patterned by a photolithography process to form a buried source layer 213 and buried drain layer 214.

Figure 6B:
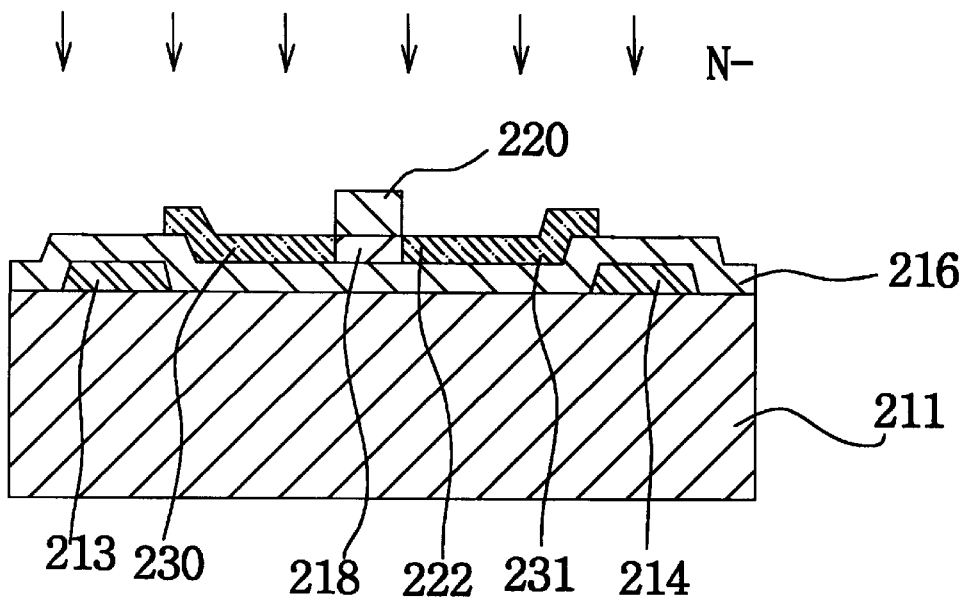

Referring to FIG. 6B, silicon oxide or silicon nitride is deposited on the substrate 211 using the CVD method to form a buffer layer 216. Next, amorphous silicon is deposited on the buffer layer 216 using the CVD method and then patterned by a photolithography process to form the active layer 218. Note that the active layer 218 is formed of amorphous silicon and so that the heat temperature during the deposition process is relatively low.

Thereafter, the block layer 220 is formed from silicon nitride or silicon oxide on the approximate central portion of the active layer 218. Note that silicon nitride or silicon oxide preferably has an etching selection ratio that is different from the buffer layer 216. The block layer 220 is then formed by depositing silicon oxide or silicon nitride using the CVD method, and then patterning the deposited silicone oxide or silicone nitride using a photolithography process so that the deposited silicone oxide or silicone nitride remains only at the approximate central portion of the active layer 218. The buffer layer 216 prevents the impurities that are in the substrate 211 from contaminating the active layer 218 while the active layer 218 is being formed.

Using the block layer 220 as a mask, N type impurities such as phosphorus (P) or P type impurities such as boron (B) lightly dope an exposed part of the active layer 218 to form an LDD region 222. The approximately central portion of the active layer 218 is not doped with impurities because of the block layer 220 and forms a channel region in the active layer 218.

Figure 6C:
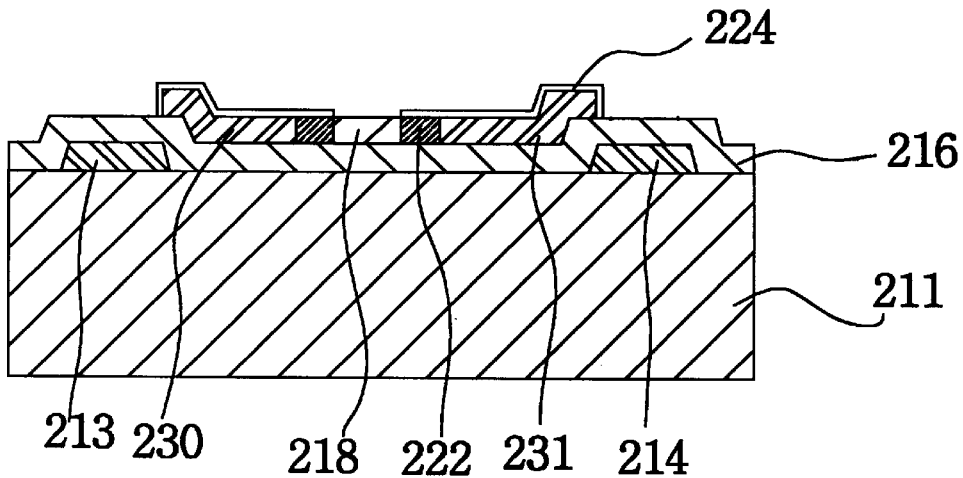

Referring to FIG. 6C, the LDD region 222 is silicidized to form the crystallization seed layer 224. The silicidization process preferably includes sputttering a metal capable of being silicidized, and preferably having a thickness of about 30 $\mu$m to about 100 $\mu$m on the buffer layer 216 so that the sputtered metal layer covers the active layer 218 and the block layer 220. A spontaneous reaction between the active layer 218 and the metal causes the boundary to be silicidized into the crystallization seed layer 224. Note that the buffer layer 216 and the block layer 220 do not react with the metal so that these layers are not silicidized. Thus, the extraneous metal on the buffer layer 216 and the block layer 220, and the active layer 218 are selectively removed preferably using wet etching with phosphoric acid (H3PO4), nitric acid (HNO3), acetic acid, (NH4)2S2O8 or a mixture of phosphoric acid, acetic acid, nitric acid and water, or other suitable etchant. Next, the block layer 220 is selectively removed preferably by etching it with fluoric acid or phosphoric acid, or other suitable etchant.

Figure 6D:
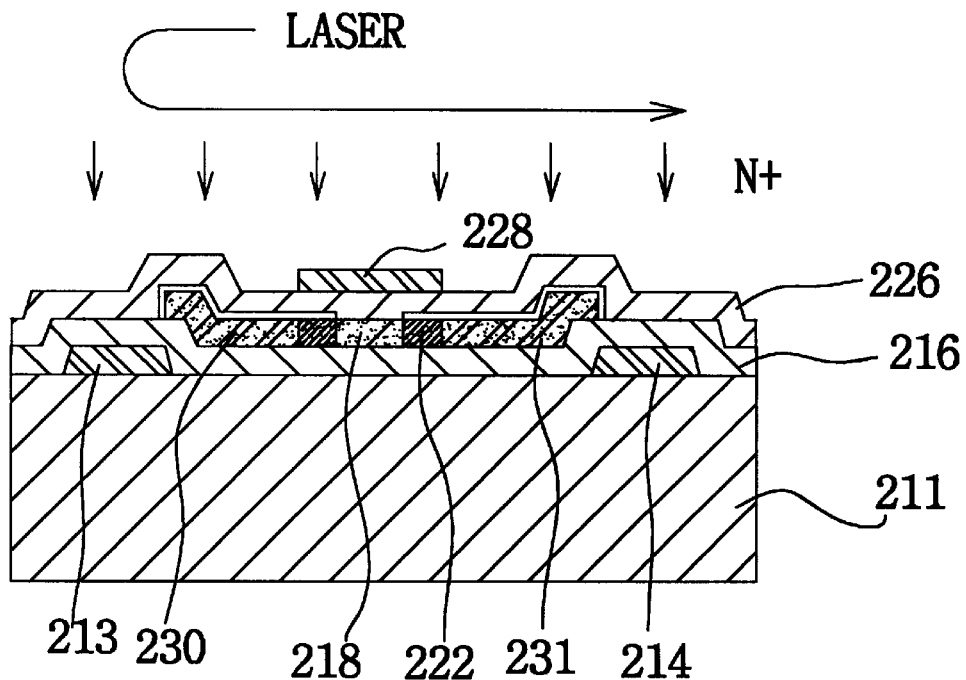

Referring to FIG. 6D, silicon oxide or silicon nitride is deposited on the buffer layer 216 using the CVD method and covers the active layer 218 and the crystallization seed layer 224, thus forming a gate insulating layer 226.

Next, a gate electrode 228 is formed on the gate insulating layer 226 at a location which corresponds to the channel region of the active layer 218. The gate electrode 228 is formed by depositing a conductive metal such as aluminum or molybdenum on the gate insulating layer 226 using either the CVD method or the sputtering method and then patterning the deposited metal preferably via a photolithography process. Note that the gate electrode 228 preferably overlaps with a portion of the crystallization seed layer 224.

Thereafter, N type impurities such as phosphorus (P) or P type impurities such as boron (B) heavily dope a portion of the active layer 218 that is not overlapped with the gate electrode 228, and forms a source region 230 and a drain region 231. The LDD region 222 is preferably now limited to the portion in the active layer 218 which is overlapped with the gate electrode 228.

The impurities in the active layer 218 that form the LDD region 222 and the source and drain regions 230 and 231 are preferably treated with laser radiation or heated in a furnace preferably at about 400° C. to about 600° C. for about 1–3 hrs. During this process, the amorphous silicon in the active layer 218 is crystallized into polysilicon through the MILC process which is caused by the crystallization seed layer 224. As the active layer 218 transforms from amorphous silicon to polysilicon, the crystals become large and uniform, thus the electrical properties of the resulting transistor also become uniform. Further, the electron mobility in the resulting transistor is also increased.

Note also that the active layer 218 is crystallized from the top to the bottom with the crystallization seed layer 224 functioning as a seed so that the grain boundary does not project from the surface of the active layer 218, and so the surface of the active layer 218 is also planarized. This also prevents additional defects in transistor characteristics from occuring.

Figure 6E:
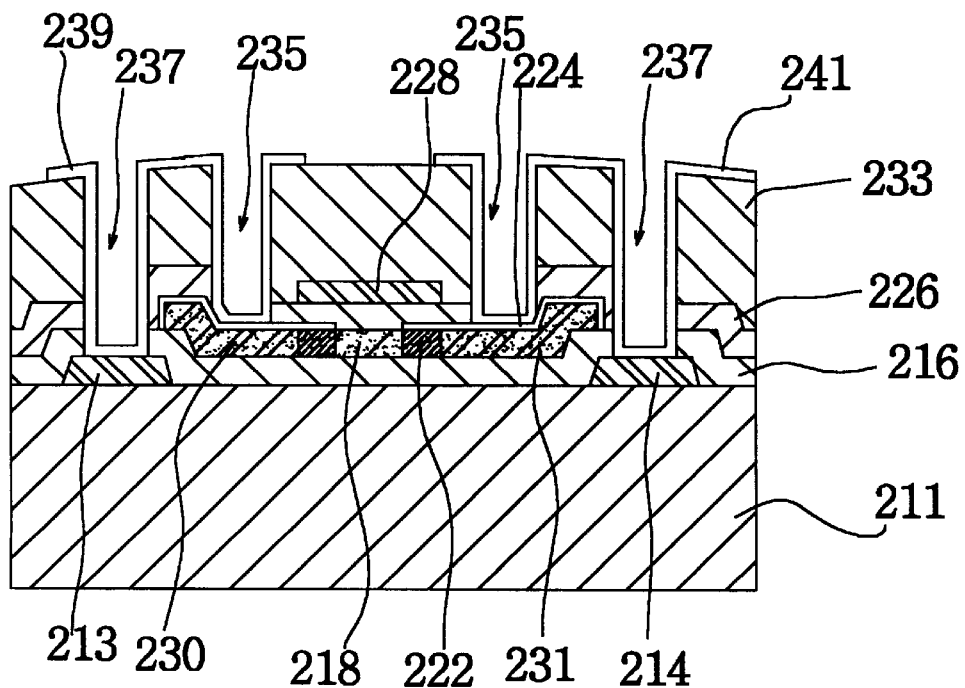

Referring to FIG. 6E, silicon oxide or silicon nitride is deposited on the gate insulating layer 226 using the CVD method and covers the gate electrode 228, thus forming the first insulating layer 233. The first insulating layer 233 is preferably formed at a temperature above about 400° C. so that the heat crystallizes the inadequately crystallized portion of the active layer 218. So again, transistor characteristics are even more greatly improved by the the preferred embodiments of the present invention.

Next, a first contact hole 235 is formed to expose the crystallization seed layer 224, and a second contact hole 237 is formed to expose the buried source and drain layers 213 and 214. The first contact hole 235 is formed by etching the gate insulating layer 226 and the insulating layer 233, while the second contact hole 237 is formed by etching the buffer layer 216, the gate insulating layer 226 and the insulating layer 233.

Next, a transparent conductive material such as ITO or TO is sputtered on the insulating layer 233 so that the transparent conductive material contacts the crystallization seed layer 224, and is electrically connected to the buried source and drain layers 213 and 214. Thereafter, the transparent conductive material is patterned preferably via a photolithography process to form a first interconnecting layer 239 which electrically connects the buried source layer 213 and the source region 230, and a second interconnecting layer 241 which electrically connects the buried drain layer 214 and the drain region 231. The second interconnecting layer 241 can also be used as a pixel electrode because it can extend to a pixel region (not shown) and is electrically connected to the drain region 231 when the buried drain layer 214 is not formed.

Note that the first and second interconnecting layers 239 and 241 are not in direct contact with the source and drain regions 230 and 231 but have the crystallization seed layer 224 interposed between the interconnecting layers 239 and 241 and the source and drain regions 230 and 231. The crystallization seed layer 224 also prevents oxidation of the source and drain regions 230 and 231 so that the contact resistance does not increase.

Figure 7A:
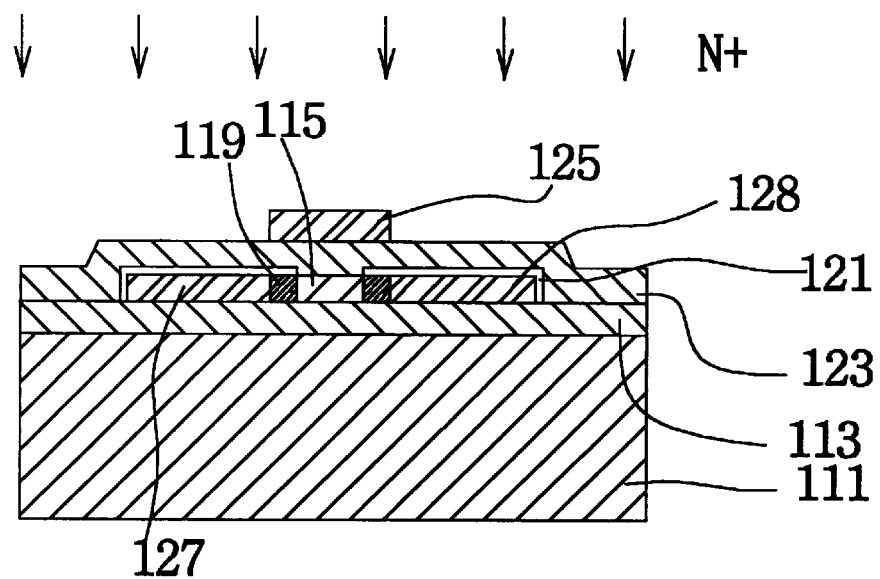
FIGS. 7A and 7B are cross-sectional views illustrating a process for manufacturing a thin film transistor according to another preferred embodiment of the present invention.
Figure 7B:
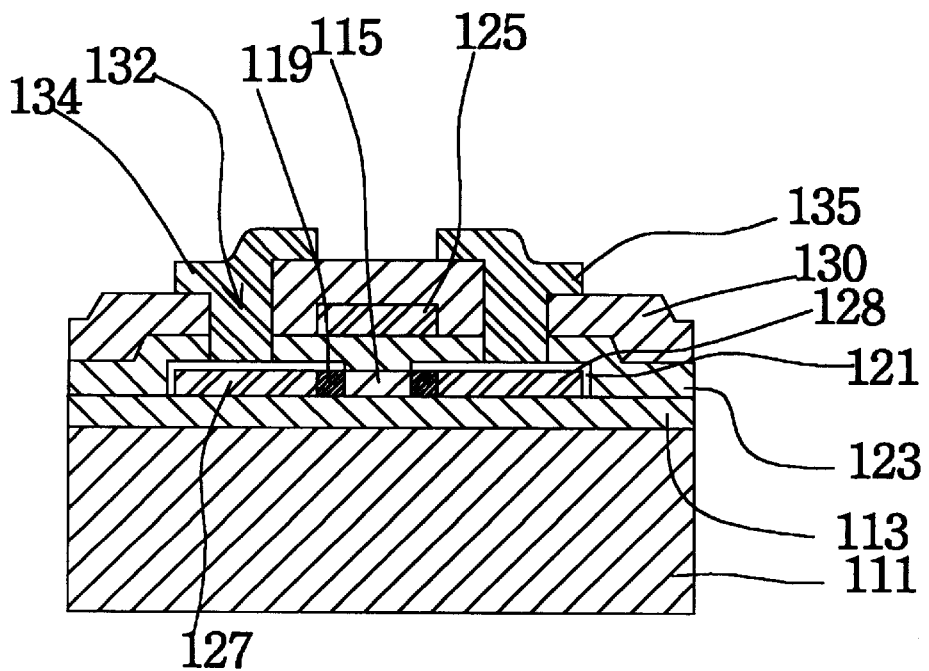

FIGS. 7A and 7B are cross-sectional views illustrating a process for manufacturing a thin film transistor according to another preferred embodiment of the present invention.

Referring to FIG. 7A, after completing the steps of the first preferred embodiment that reference FIGS. 5A and 5B, silicon oxide or silicon nitride is preferably deposited on the buffer layer 113 using the CVD method and covers the active layer 115 and the crystallization seed layer 121, thus forming a gate insulating layer 123.

Next, a gate electrode 125 is formed on the gate insulating layer 123 at a location which corresponds to the channel region of the active layer 115. The gate electrode 125 is preferably formed by depositing a conductive metal such as aluminum or molybdenum on the gate insulating layer 123 using either the CVD method or the sputtering method and then patterning the metal by a photolithography process. Note that the gate electrode 125 preferably overlaps with a portion of the crystallization seed layer 121.

Thereafter, N type impurities such as phosphorus (P) or P type impurities such as boron (B) heavily dope a portion of the active layer 115 that is not overlapped with the gate electrode 125, and forms a source region 127 and a drain region 128. The LDD region 1 19 is now preferably limited to the portion in the active layer 115 which is overlapped with the gate electrode 125.

Referring to FIG. 7B, silicon oxide or silicon nitride is deposited on the gate insulating layer 123 using the CVD method and covers the gate electrode 125, thus forming a first insulating layer 130. The first insulating layer 130 is formed at a temperature greater than about 400° C. so that the impurities that have been implanted in the active layer 115 are activated, and the source and drain regions 127 and 128 are formed. Also, the amorphous silicon of the active layer 115 is crystallized into polysilicon through the MILC process, which is caused by the crystallization seed layer 121. Note that as the active layer 115 transforms from amorphous silicon to polysilicon, the crystals become large and uniform so that the electrical properties of the resulting transistor also become uniform. Further, the electron mobility in the resulting transistor is also increased by the crystallization process.

Note also that the active layer 115 is crystallized from the top to the bottom with the crystallization seed layer 121 functioning as a seed so that the grain boundary does not project from the surface of the active layer 115, and so the surface of the active layer 115 is also planarized. This also prevents additional defects in transistor characteristics from occuring.

Next, the first insulating layer 130 and the gate insulating layer 123 are etched to form a first contact hole 132, which exposes the crystallization seed layer 121. Thereafter, a metal such as aluminum or molybdenum is sputtered on the first insulating layer 130 so that the metal is buried in the first contact hole 132 and contacts the crystallization seed layer 121. The sputtered metal is then patterned so that it forms source and drain electrodes 134 and 135, which are electrically connected to the source and drain regions 127 and 128. Thus, a pixel electrode is also formed.

As described above, this preferred embodiment involves crystallization of the active layer 115 into polysilicon crystals, not by a laser annealing process, but by the MILC process which is caused by the heat generated during formation of the first insulating layer 130. One advantage of this preferred embodiment is that it greatly simplifies the manufacturing process.

Accordingly, preferred embodiments of the present invention provide many advantages over the prior art, such as, the active layer is formed of polysilicon so as to have crystals which are uniform in size making the electrical properties of the resulting transistor uniform, the source and drain regions are not in direct contact with the first and second interconnecting layers so that oxidation of the source and drain regions is avoided to prevent the contact resistance from increasing, the surface of the active layer is planarized because a crystallization of the active layer proceeds from the top to the bottom, and thus defects in transistor performance are further prevented, and an overlapping portion between the silicide seed layer and the gate metal, if it is not sufficiently activated or crystallized, can be more activated or crystallized during the deposition of a passivation layer, which preferably occurs at a temperature greater than about 400° C.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a thin film transistor comprising the steps of:

depositing amorphous silicon on a substrate and patterning the deposited amorphous silicon to form an active layer;

forming a block layer substantially centrally located on the active layer to function as a mask during an impurity doping process so that a channel region is defined in a approximately central portion in the active layer;

silicidizing an exposed surface of the active layer to form a crystallization seed layer, and, thereafter, removing the block layer;

forming a gate insulating layer on the substrate so that the gate insulating layer covers the active layer and the crystallization seed layer;

defining a gate electrode on the gate insulating layer so that the gate electrode is located substantially on a portion which corresponds to the channel region of the active layer, and wherein the gate electrode overlaps with a portion of the crystallization seed layer; and heavily doping impurities in the active layer using the gate electrode as a mask to form source and drain regions in the active layer, and converting the active layer from amorphous silicon to polysilicon through a metal induced lateral crystallization process caused by the crystallization seed layer.

2. The method according to claim 1, further comprising the step of forming a buffer layer on the substrate from an insulating material selected from the group consisting of silicon oxide or silicon nitride.

3. The method as claimed in claim 2, wherein the step of forming the block layer further comprises the step of selecting silicon nitride or silicon oxide so that the block layer has a different etching selection ratio than that of the buffer layer.

4. The method according to claim 1, wherein the crystallization seed layer is formed by depositing a high melting point metal including at least one of titanium, chrome, nickel, molybdenum, tantalum, cobalt, platinum, and tungsten, and silicidizing a boundary between the active layer and the deposited high melting point metal via a spontaneous reaction of the active layer and the deposited high melting point metal.

5. The method as claimed in claim 1, wherein the impurities inside of the active layer are activated to crystallize the active layer by using laser radiation or by a heat treatment at a temperature of about 400° C. to about 600° C. for about 1 to about 3 hours.

6. The method according to claim 1, further comprising the steps of:

forming a first insulating layer on the gate insulating layer so as to cover the gate electrode;

creating a first contact hole exposing the crystallization seed layer on the source and drain regions;

forming source and drain electrodes in the first contact hole so that the electrodes are in contact with the crystallization seed layer;

creating a second insulating layer on the first insulating layer that covers the source and drain electrodes;

forming a second contact hole exposing the drain electrode; and forming a pixel electrode on the second insulating layer to be in contact with the drain electrode through the second contact hole.

7. The thin film transistor according to claim 6, wherein the step of forming the first insulating layer is performed at a temperature that is greater than about 400° C. so that an inadequately crystallized portion in the active layer is further crystallized.

8. A method of manufacturing a thin film transistor comprising the steps of:

forming buried source and drain layers on a portion of a substrate;

forming a buffer layer on the substrate so as to cover the buried source and drain layers;

depositing amorphous silicon on the buffer layer and patterning the deposited amorphous silicon to form an active layer;

forming a block layer on an approximately central portion of the active layer, wherein the block layer functions as a mask during a doping process to define a channel region in the active layer, and, wherein the block layer is made of silicon nitride or silicon oxide having a different etching selection ratio than the buffer layer; and silicidizing an exposed surface of the active layer to form a crystallization seed layer, and, thereafter, removing the block layer.

9. The thin film transistor according to claim 8, further comprising the steps of:

forming a gate insulating layer on the buffer layer so as to cover the active layer and the crystallization seed layer;

forming a gate electrode on the gate insulating layer so that the gate electrode is located substantially on a portion which corresponds to the channel region of the active layer, and wherein the gate electrode also overlaps with a portion of the crystallization seed layer;

heavily doping impurities in the active layer while using the gate electrode as a mask to form a source region at a first end of the active layer and a drain region at a second end of the active layer; and converting the active layer from amorphous silicon to polysilicon through a metal induced lateral crystallization process caused by the crystallization seed layer, while activating the doped impurities.

10. The thin film transistor according to claim 9, further comprising the steps of:

forming an insulating layer covering the gate electrode on the gate insulating layer, and forming a first contact hole exposing the crystallization seed layer on the source and drain regions and a second contact hole exposing the buried source and drain layers; and forming a first interconnecting layer that connects the buried source layer and crystallization seed layer on the source region, and a second interconnecting layer that connects the buried drain layer and the crystallization seed layer on the drain region.

11. The method according to claim 8, further comprising the step of forming an LDD region in the active layer.

12. The method according to claim 8, wherein the step of forming the crystallization seed layer is performed by depositing a high melting point metal including at least one metal selected from the group consisting of titanium, chrome, nickel, molybdenum, tantalum, cobalt, platinum, and tungsten, and silicidizing a boundary between the active layer and the deposited metal through a spontaneous reaction of the active layer and the metal.

13. The method according to claim 9, wherein the impurities inside of the active layer are activated to crystallize the active layer using laser radiation or by heating the active layer at a temperature between about 400° C. to about 600° C. for about 1 to about 3 hrs.

14. The method according to claim 10, wherein the first and second interconnecting layers are made of a transparent conductive material selected from the group consisting of indium tin oxide or tin oxide.

15. A method of manufacturing a thin film transistor comprising the steps of:

depositing amorphous silicon on a substrate and patterning the deposited amorphous silicon to form an active layer;

forming a block layer at an approximately central portion on the active layer, and using the block layer as a mask during a doping process to define a channel region in the active layer;

silicidizing an exposed surface of the active layer to form a crystallization seed layer, and, thereafter, removing the block layer;

forming a gate insulating layer on the substrate so as to cover the active layer and the crystallization seed layer;

forming a gate electrode on the gate insulating layer so that the gate electrode is located substantially on a portion which corresponds to the channel region of the active layer, and wherein the gate electrode also overlaps with a portion of the crystallization seed layer;

heavily doping impurities into the active layer using the gate electrode as a mask to form a source region and a drain region; and forming an insulating layer on the gate insulating layer to cover the gate electrode;

converting the active layer from amorphous silicon to polysilicon through a metal induced lateral crystallization process caused by the crystallization seed layer.

16. The method as claimed in claim 15, wherein the insulating layer is formed at a temperature greater than about 400° C.

* * * * *